(12) United States Patent
Arambepola et al.

(10) Patent No.: US 8,908,810 B2
(45) Date of Patent: Dec. 9, 2014

(54) SYSTEMS AND METHODS FOR IMPLEMENTING SOFT-DECISION REED-SOLOMON DECODING TO IMPROVE CABLE MODEM AND CABLE GATEWAY PERFORMANCE

(71) Applicant: Intel Corporation, Santa Clara, CA (US)

(72) Inventors: Bernard Arambepola, Enfield (GB); Murat Badem, Borehamwood (GB); Parveen K. Shukla, Nottingham (GB); Sahan Gamage, Cambridge (GB); Thushara Hewavithana, Hatfield (GB); Naor Goldman, Ein-Vered (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/728,022

(22) Filed: Dec. 27, 2012

(65) Prior Publication Data

US 2014/0185657 A1    Jul. 3, 2014

(51) Int. Cl.
| *H04L 27/38* | (2006.01) |
| *H04L 27/06* | (2006.01) |
| *H04L 1/00*  | (2006.01) |

(52) U.S. Cl.
CPC ............... *H04L 27/06* (2013.01); *H04L 27/38* (2013.01); *H04L 1/0045* (2013.01)
USPC ........................... 375/332; 375/330; 375/340

(58) Field of Classification Search
CPC ..... H04L 27/38; H04L 1/0045; H04L 1/0047; H04L 1/0054
USPC ......... 375/222, 298, 332, 341, 261, 340, 330; 725/111
See application file for complete search history.

(56) References Cited

U.S. PATENT DOCUMENTS

| 2006/0085727 | A1* | 4/2006 | Azenkot et al. ............... 714/792 |
| 2010/0177837 | A1* | 7/2010 | Leonidovich et al. ........ 375/267 |
| 2012/0250805 | A1* | 10/2012 | Shin ............................. 375/341 |

\* cited by examiner

*Primary Examiner* — Betsy Deppe
(74) *Attorney, Agent, or Firm* — Ellis B. Ramirez; Prass LLP

(57) ABSTRACT

A system and method are provided for implementing a soft Reed-Solomon (RS) decoding scheme, technique or algorithm to improve physical layer performance in cable modems and cable gateways. The algorithm is implemented in a forward error correction (FEC) module connected to a QAM demodulator. The RS decoding scheme is implemented without significantly complicating hardware or processing overhead. The soft Reed-Solomon (RS) decoding scheme extracts candidate RS symbols and their Log Likelihood Ratios (LLRs) from QAM symbols. The set of highest probable candidate blocks are then chosen and these are decoded using a variant of the Chase algorithm until a valid codeword is detected at the decoder output.

32 Claims, 8 Drawing Sheets

SYSTEMS AND METHODS FOR IMPLEMENTING SOFT-DECISION REED-SOLOMON DECODING TO IMPROVE CABLE MODEM AND CABLE GATEWAY PERFORMANCE

BACKGROUND

1. Field of the Disclosed Embodiments

This disclosure relates to systems and methods for implementing a soft-decision Reed-Solomon (RS) decoding scheme, technique or algorithm to improve physical layer performance in cable modems and cable gateways.

2. Related Art

Much of the work in advancing communication technologies in recent years, particularly emphasizing higher data rates and transmission speeds, has focused on advances in wireless technology transmission and reception. Corresponding advances in communication capabilities and capacities for cable gateways and cable modems, and the technologies housed in these components, remain important, even critical. Consider that, for individual structures such as individual residential homes that include dispersed wireless networks internal to and throughout the structure, the wireless modem or modems deployed throughout the structure are likely connected to coaxial cables as a data transmission medium for the data to get to the structure where it is then disseminated throughout the structure wirelessly. In this regard, the cable backbone, which often includes some combination of fiber and coaxial cables (hybrid fiber/coaxial cable systems), forms a significant and equally important part of an overall broadband network system. In the hybrid fiber/coaxial cable systems, fiber transmission cables form a significant portion of the cable backbone, but the connections to individual structures and to one or more of the wireless modems deployed within those structures are often made using coaxial cables.

The standard by which data transmission by cable is defined is the Data Over Cable Service Interface Specification or DOCSIS. DOCSIS is an international telecommunications standard that permits, among other technologies, the addition of high-speed data transfer to an existing cable television (CATV) system. DOCSIS is employed, for example, by many cable television operators to provide Internet access over existing hybrid fiber/coaxial cable systems and network infrastructures. DOCSIS, therefore, defines the mechanism by which data is transmitted over cable transmission lines to individual structures and the devices and access points that may be housed in those structures.

The DOCSIS 3.0 standard regarding physical layer specifications was released in its latest revision on Nov. 17, 2011 (the first revision was issued on Aug. 4, 2006). DOCSIS 3.0 is generally a specification revision that realized significantly increased transmissions speeds, and introduced support for Internet Protocol version 6 (IPv6). Current cable systems in Europe and Asia based on the DOCSIS standard use the physical layer defined in the International Telecommunication Union Recommendation J.83, Annex A (ITU-T J83-A). This standard is based on single-carrier quadrature amplitude modulation (QAM) and the physical layer channel bandwidths of 6, 7 or 8 MHz. Current versions of DOCSIS specify that 64-level or 256-level QAM (64-QAM or 256-QAM) be used for modulation of the downstream data transmissions. QAM represents a format by which digital data is transmitted over coaxial cables.

A DOCSIS architecture includes two primary components: a cable modem (CM) located at the end-user structure, and a cable modem termination system (CMTS) located, for example at the CATV head end. Cable systems supporting on-demand programming use a hybrid fiber/coaxial cable system. Fiber optic lines bring digital signals to nodes in the system where they are converted into RF channels and modem signals on coaxial trunk lines. DOCSIS is exploring mechanisms to further increase bit rates carried by the coaxial cable trunk lines.

In coding theory, Reed-Solomon (RS) codes are generally understood to encompass non-binary cyclic error-correcting codes, including deriving codes to detect and correct multiple random symbol errors. RS codes give rise to efficient decoding algorithms. RS codes have found important applications in consumer electronics, such as CDs, DVDs, Blu-ray Discs. They are, however, equally important in applications involving data transmission technologies such as DSL and WiMAX, applications involving broadcast systems such as DVB and ATSC, and in certain computer applications.

BRIEF DESCRIPTION OF THE DRAWINGS

Various exemplary embodiments of the disclosed systems and methods for implementing a soft RS decoding scheme, technique or algorithm to improve physical layer performance in cable modems and cable gateways, according to this disclosure will be described, in detail, with reference to the following drawings, in which.

DETAILED DESCRIPTION OF THE DISCLOSED EMBODIMENTS

Figure 1:
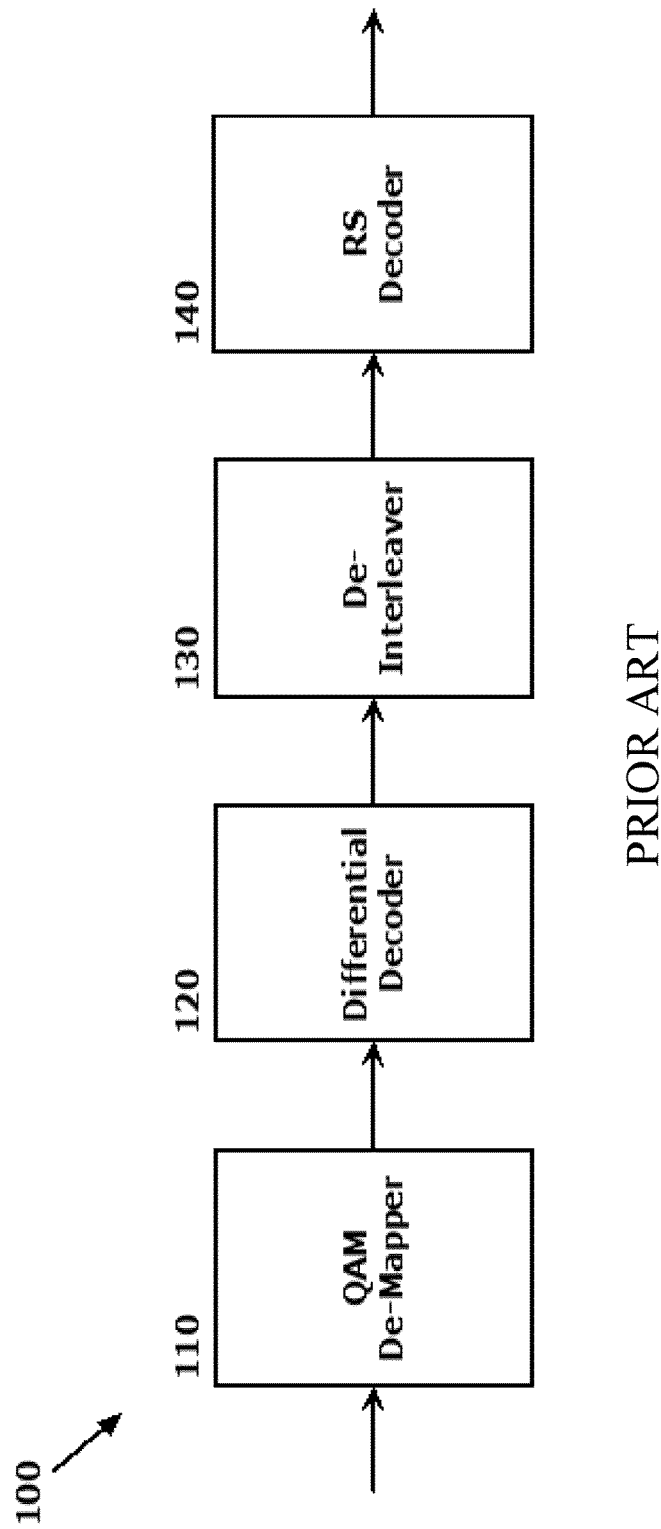
FIG. 1 illustrates a simple schematic representation of a typical hard decision forward error correction module including RS decoding.

As indicated above, QAM modulation based on an ITU-T J83-A standard is widely used as the physical layer of Euro-DOCSIS cable modems and gateways generally operating with bandwidths of 8 Mhz. The maximum QAM constellation according to this standard is 256-QAM. With the push for increased data rates, cable operators have led the efforts to extend this to 1024-QAM to achieve significant increases in capacity. Commensurate with this increase, however, is a corresponding requirement for a relatively high Signal-to-Noise Ratio (SNR) to, for example, around 35 dB.

It would be advantageous implementations at 1024-QAM to provide a receiver in which this SNR requirement could be reduced. Any reduction would likely be considered attractive and render system designs more practical. Even a 1 dB reduction would relax design considerations and specifications for other components in the system including for the tuner.

Exemplary embodiments of the disclosed systems and methods may provide a soft-RS-symbol generation scheme, technique and/or algorithm to enable soft-input RS decoding in a forward error correction (FEC) module connected to the QAM demodulator.

Exemplary embodiments may achieve in excess of a 1 dB reduction in the SNR requirement over conventional hard-RS decoding.

Exemplary embodiments may be implemented without significantly complicating hardware or processing overhead. A typical receiver hardware requirement in an FEC module to implement the disclosed scheme may be comparatively modest, e.g., on an order of approximately 50K gates.

Exemplary embodiments may thus provide a relatively low cost scheme by which to significantly improve product performance and competitive advantage in a very competitive technology area and market. Simulations have proven to produce performance gain of 1 dB at the DOCSIS quasi-error-free (QEF) bit-error-rate (BER) of 1.0e-8. For digital video applications where the QEF BER is much lower (<1.0e-10) the performance gain is expected to be much higher than 1 dB. In embodiments, even at 1.0e-8 BER, the performance gain can be increased further through additional candidate decoding.

Exemplary embodiments, although developed with reference to a 1024-QAM constellation and an 8 bits/symbol (GF$[2^8]$) RS decoder as may be appropriate for a specific application in digital cable, may have wider applicability. Those of skill in the art recognize that the designation "GF$[2^8]$" as used in the context of this disclosure refers to a finite field is a field with a finite field order or number of elements, which is referred to as a Galois field. The order of a finite field is always a prime or a power of a prime, in this case $2^8$. In embodiments, applicability to virtually any QAM modulation using any RS symbol size, with or without differential decoding, are contemplated.

These and other features, and advantages, of the disclosed systems and methods are described in, or apparent from, the following detailed description of exemplary embodiments.

The disclosed systems and methods may implement a scheme that specifies extracting candidate RS symbols and their Log Likelihood Ratios (LLRs) from QAM symbols. These RS symbols and LLRs may be employed by a soft decision FEC scheme or module to effectively reduce the SNR requirement in a cable modem or cable gateway system. As indicated briefly above, the disclosed scheme was developed with reference to a 1024-QAM constellation and an 8 bits/symbol (GF$[2^8]$) RS decoder as required for digital cable communications. The disclosed scheme may thus be particularly adaptable to such an application. References to either or both of a 1024-QAM constellation and an 8 bits/symbol (GF$[2^8]$) RS decoder will be used throughout this disclosure for clarity, conciseness and understanding of a single implementation for the disclosed embodiments. These references should be considered, however, exemplary only and not limiting, in any way to the disclosed systems and methods. In particular, the disclosed schemes for implementing a soft decision FEC may be equally applicable to systems and devices using any QAM modulation or any OFDM modulation with QAM subcarriers, with any RS symbol size and with or without differential decoding.

Specific reference to, for example, any particular gateway-centric or modem-centric system or device should also be understood as being exemplary only, and not limited, in any manner, to any particular class of devices, including any particular cable gateways and/or cable modem devices. The systems and methods according to this disclosure may be particularly adaptable to being hosted on a cable backbone, including a hybrid fiber/coaxial cable backbone that may provide, for example, a coaxial connection to a cable modem in a structure, but should not be considered as being limited to only such implementations, systems or devices.

Individual features and advantages of the disclosed systems and methods will be set forth in the description that follows, and will be, at least in part, obvious from the description, or may be learned by practice of the features described in this disclosure. The features and advantages of the systems and methods according to this disclosure may be realized and obtained by means of the individual elements, and combinations of those elements, as particularly pointed out in the appended claims. While specific implementations are discussed, it should be understood that this is done, as detailed above, for clarity and illustration purposes only. A person skilled in the relevant art will recognize that other components and configurations may be used without departing from the spirit and scope of the subject matter of this disclosure.

In the disclosed systems and methods, after generating candidate symbols with accurate LLRs, a set of highest probable candidate blocks are chosen. These highest probable candidate blocks are decoded, using, for example, a variant of the Chase algorithm, until a valid codeword is detected at a decoder output. A size of the RS symbols (8-bit), as discussed, is different from a size of QAM symbols (10-bit). A differential decoder combines successive QAM symbols. The proposed scheme is independent of the choice of QAM and RS symbol bit-widths and is also independent of the choice of differential decoder (e.g., the decoder could be of a unitary or pass through configuration). Again, the disclosed schemes are not limited by the embodiments specified in this application and are contemplated as having broad applicability.

Simulations of the disclosed schemes for soft-input RS decoding reveal an SNR performance gain over a conventional hard-input RS of approximately 1 dB for 1024-QAM at a BER of 1.0e-8 in the QEF performance as defined by the DOCSIS standard. Because the gain can be increased further through additional candidate decoding at a cost of some additional hardware complexity, the inventors' practical application targeted a 1 dB performance gain. This performance gain was achievable with a comparatively modest increase in hardware over a conventional decoder implementation.

Additionally, estimations based on the simulations support a conclusion that additional advantages may exist for digital video applications. The QEF BER for digital video applications is significantly lower (<1e-10). Simulation results have been graphically extrapolated for these BERs. A comparison of performance for the disclosed soft-input RS decoder in the simulated range as compared to performance for the conventional hard-input RS decoder sows that, as BER decreases, SNR improvement increases. Thus for digital video applications operating at significantly lower BERs, it is anticipated that the performance gain, will be higher than that for the simulated conditions, i.e., higher than 1 dB for digital video applications operating at the lower BERs.

Those of skill in the art recognize that an RS(204, 188) code is defined in GF[$2^8$] with a block size of 204 bytes with 188 information bytes. For the disclosed soft-input decoding, it is appropriate to decode many candidate 204-byte blocks for each output block using a hard-input RS decoder. Candidate blocks are chosen in a decreasing order of probability using the LLRs. A hard-input RS decoder is designed to decode one RS block in 16 (540 MHz) clock cycles. In truth, it is recognized that the RS decoder may not completely decode the block in the 16 clock periods. Rather, the RS decoder may perform only that processing necessary to determine that a particular block is correctable during that time. When such a block is detected, the RS decoder completes the decoding process to output that block.

The 1024-QAM symbol rate is 7 MBaud. As such, there are 12590 clock (540 MHz) cycles per 204-byte block. Using a 16-cycle RS decoder, up to 786 candidate blocks can be decoded. Allowing for some overhead, a reasonable estimate according to the disclosed scheme is to decode 750 candidate blocks. A total gate-count for an LLR generator and a very fast hard-input RS decoder to carry into effect the disclosed scheme in anticipation of decoding 750 candidate blocks is about 50K.

FIG. 1 illustrates a simple schematic representation 100 of a typical conventional hard decision forward error correction module including RS decoding. At a receiver side, according to FIG. 1, the demodulated QAM-1024 samples are mapped into 10-bit QAM symbols in QAM de-mapper (demodulator) 110. Successive pairs of QAM symbols are differentially decoded with a differential decoder 120. A resulting 10-bit symbols sequence is transformed into a bit stream and then partitioned into bytes using frame alignment data. The bytes are then passed to a de-interleaver 130, an objective of which is to reduce an impact of burst errors. The processed bytes are then passed to an RS decoder 140 for forward error correction.

Figure 2:
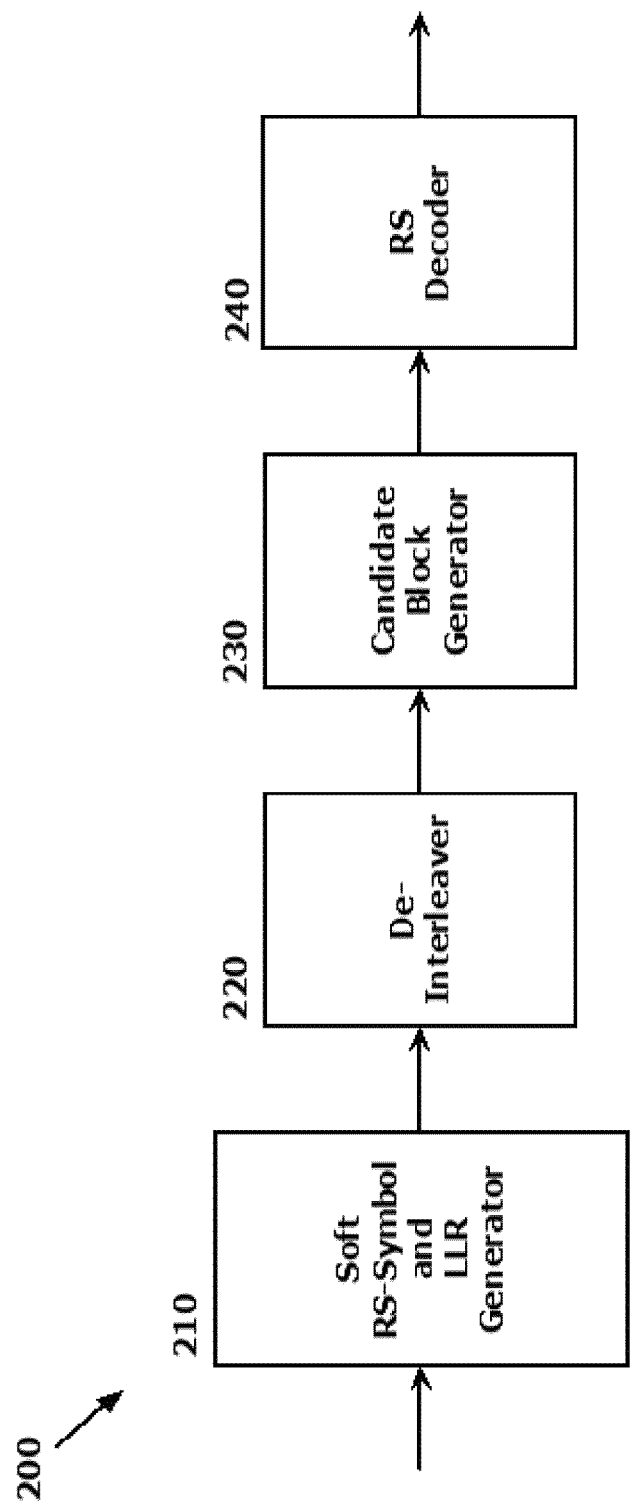
FIG. 2 illustrates a simple schematic representation of an exemplary soft decision forward error correction module incorporating the soft RS decoding scheme according to this disclosure.

FIG. 2 illustrates a simple schematic representation 200 of an exemplary soft decision forward error correction module incorporating the soft RS decoding scheme according to this disclosure. As shown in FIG. 2, the QAM de-mapper and the differential decoder may be merged into a soft RS-symbol and LLR generator 210. The soft RS-symbol and LLR generator 210 may output candidate RS symbols and their probabilities as indicated by LLRs for the candidate RS symbols. The resulting candidate RS symbols and corresponding LLRs may be passed successively to a de-interleaver 220, candidate block generator 230 and RS decoder 240 for further processing in a conventional manner. Lead bytes and one or more candidate bytes may be presented to the de-interleaver 220. These lead blocks and candidate blocks may be ordered by the candidate block generator 230 and presented to the RS decoder 240. As many as 750 candidate blocks may be presented, according to the disclosed scheme, in 1024-QAM. When the RS decoder 240 determines that a candidate block, including the lead block, is correctable, the RS 240 decoder identifies that block for correction in a conventional manner and the disclosed scheme ceases. A key objective of the disclosed scheme in obtaining increased decoding performance lies in the generation of the LLR data. The soft RS-symbol and LLR generator 210 may execute a scheme based on the algorithm outlined below to generate high quality LLR data.

Figure 3:
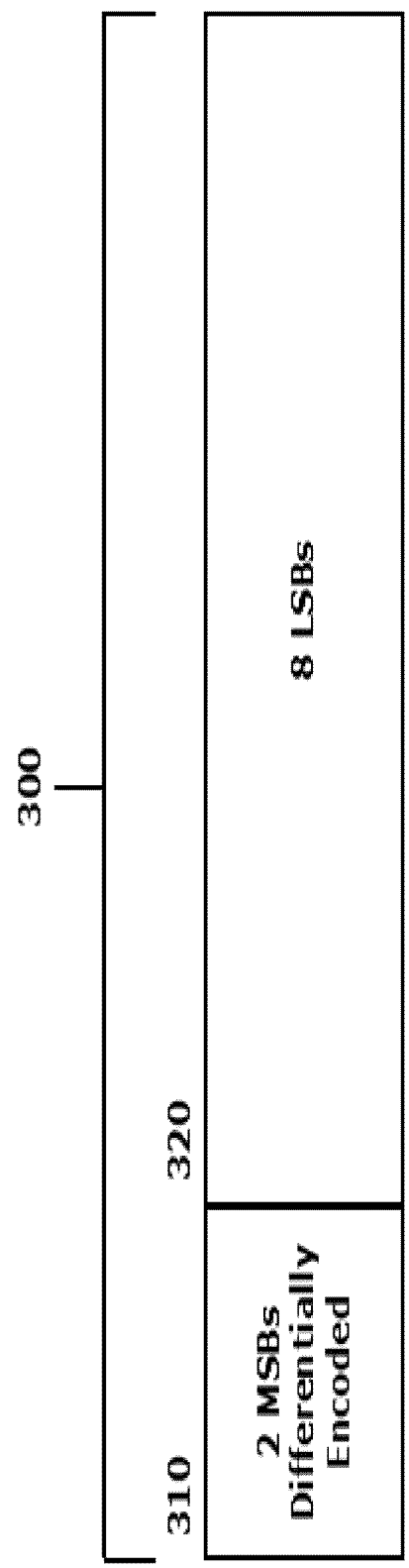
FIG. 3 illustrates a typical 10-bit QAM symbol used in 1024-QAM modulation.

FIG. 3 illustrates a typical 10-bit QAM symbol 300 used in 1024-QAM modulation. The discussion below is focused on such a 10-bit QAM symbol 300, which may consist of two differentially encoded most significant bits (MSBs 310) and 8 further least significant bits (LSBs 320).

An exemplary embodiment of the disclosed scheme may use such 10-bit 1024-QAM symbols with differential decoding and 8-bit RS symbols defined over the finite field GF[$2^8$]. This choice provided ease in the practical application of the disclosed scheme. It must be noted again, however, that application of the disclosed scheme is more general than that involving only this theoretical application. The disclosed concepts are not limited in any way by the modulation or the RS decoding parameters. For example, the disclosed scheme may be used with 9-bit 512-QAM symbols with a 7 bits per symbol RS code in GF[$2^7$]. The disclosed scheme may be equally applicable for use with 11-bit 2048-QAM symbols or 12-bit 4096-QAM symbols, each with 8 bits per symbol RS code in GF[$2^8$]. It is recognized that these latter examples may become useful at a later stage in standards development and implementation to achieve an even greater capacity increase from digital cable systems.

Figure 4:
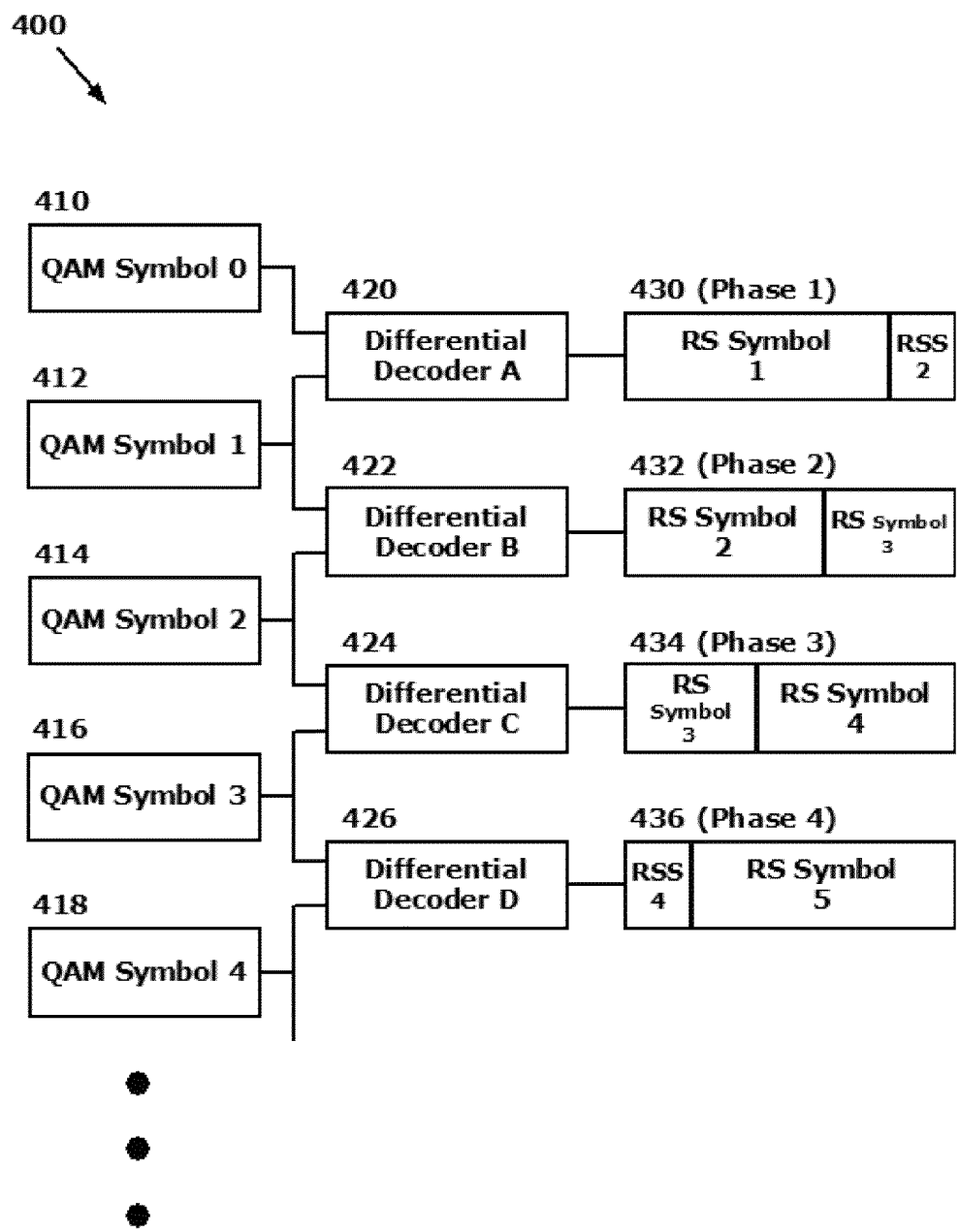
FIG. 4 illustrates an exemplary scheme for differential decoding and QAM symbol to RS symbol mapping that is usable with the systems and methods according to this disclosure.

FIG. 4 illustrates an exemplary scheme 400 for differential decoding and QAM symbol to RS symbol mapping that is usable with the systems and methods according to this disclosure. As shown in FIG. 4, successive pairs of QAM symbols (QAM symbol 0 410, QAM symbol 1 412, QAM symbol 2 414, QAM symbol 3 416, QAM symbol 4 418, . . . ) are decoded by individual differential decoders A-D 420-426. Each QAM symbol has 10 bits. Outputs of the differential decoders A-D 420-426 are 10 bits. The RS symbols used in the GF[$2^8$] are 8-bit. Hence, five RS symbols map to four QAM symbols as shown in FIG. 4.

According to the above, two successive QAM symbols are differentially decoded. Also, as shown in FIG. 4, the RS derived symbols may straddle QAM symbol boundaries. As a result, each RS symbol may be a function of two QAM symbols. This structure is accounted for in the probability analysis provided below.

Figure 5:
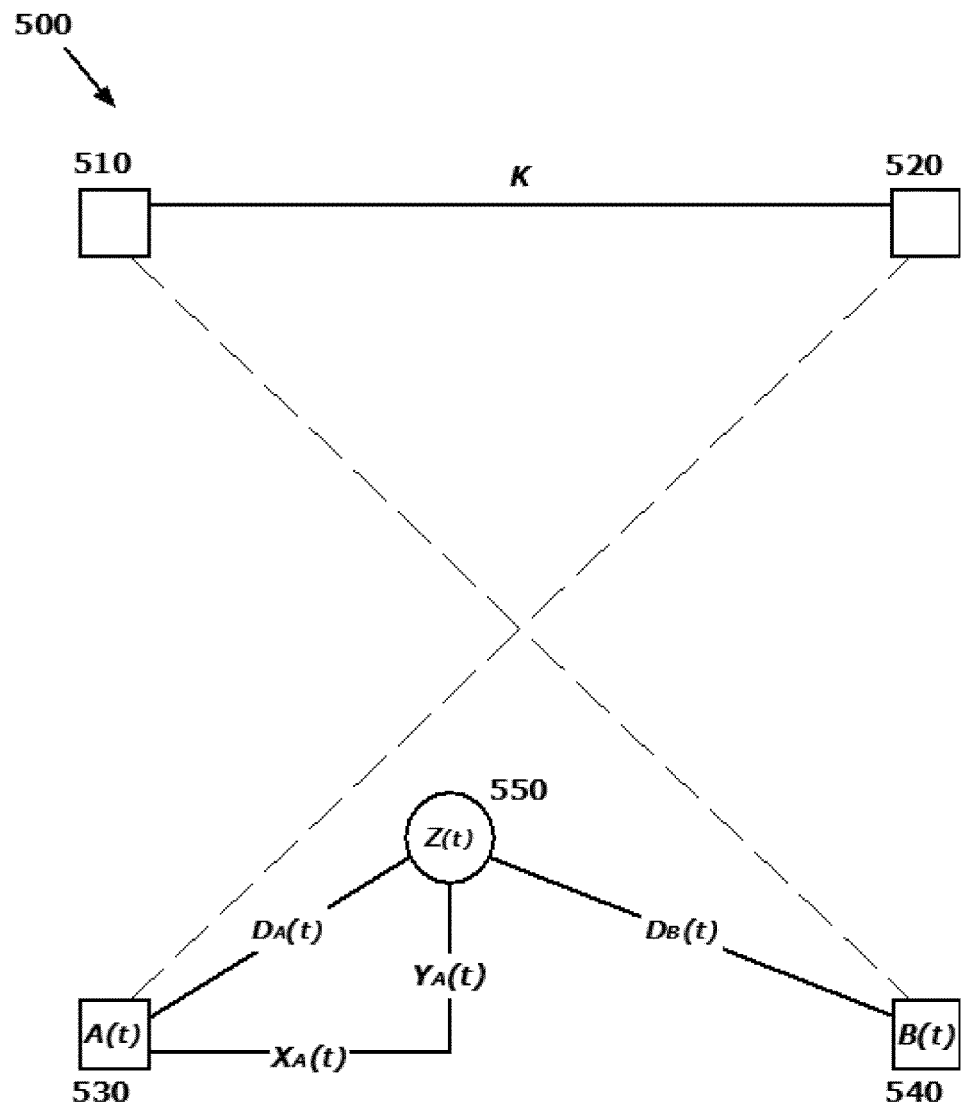
FIG. 5 illustrates an exemplary single grid square from a 32 by 32 grid of a 1024-QAM constellation that includes an illustration of elements of the soft RS decoding scheme according to this disclosure.

FIG. 5 illustrates an exemplary single grid square 500 from a 32 by 32 grid of a 1024-QAM constellation that includes an illustration of elements of the soft RS decoding scheme according to this disclosure. The single grid square includes constellation points 510-540.

A received signal symbol may be represented by a point 550 in the constellation. Other cases in which the received signal symbol is outside the constellation can be analyzed as special cases of the disclosed scheme detailed below. FIG. 5 includes annotations that will aid in an understanding of the disclosed scheme.

The following notation is used in the probability analysis given below:

$Z(t)$: Received complex number (QAM Symbol) at time t.

$A(t)$: Nearest QAM constellation point at time t. Note that, under conventional schemes, which the disclosed schemes improve upon, the received QAM symbol is mapped to this nearest QAM constellation point at time t.

$B(t)$: Next nearest QAM constellation point at time t.

$D_A(t)$: Distance to the nearest QAM symbol A(t) at time t.

$D_B(t)$: Distance to the next nearest QAM symbol B(t) at time t.

$X_A(t)$: The X component of the distance from Z(t) to A(t).

$Y_A(t)$: The Y component of the distance from Z(t) to A(t).

K: Distance between adjacent QAM constellation points in the X or Y dimensions.

The disclosed scheme takes the two QAM constellation points (A(t) and B(t) in this example) nearest to the received signal (Z(t) in this example). Z(t) is received from QAM demodulator having an analog to digital (A/D) converter. Z(t) is a final output symbol from demodulator. Conventional hard-input RS decoders map received signal points, such as Z(t) to nearest value (grid point) in the QAM constellation. Here, A(t) would be selected. The disclosed process takes account of the next nearest grid point, B(t), as well as A(t). Distances are calculated to both these points. For every received point Z, there will be corresponding points A and B. Every QAM in FIG. 5, there will be two points A and B. Phase 1, for example will include points A0, B0, A1 and B1. RS symbols will be derived according to the four combinations. Noise is Gaussian distributed. Then there are four possible RS symbols (some of which could be the same) corresponding to:

$$\text{RS\_Symbol}(0) = f(A(t-1), A(t), \text{Phase}) \quad \text{Equation 1a}$$

$$\text{RS\_Symbol}(1) = f(A(t-1), B(t), \text{Phase}) \quad \text{Equation 1b}$$

$$\text{RS\_Symbol}(2) = f(B(t-1), A(t), \text{Phase}) \quad \text{Equation 1c}$$

$$\text{RS\_Symbol}(3) = f(B(t-1), B(t), \text{Phase}) \quad \text{Equation 1d}$$

The function $f(S, R, T)$ above depends on:
1. Differential decoding;
2. Phase of the RS symbol within QAM symbol (referred to as "Phase(s)" 1-4 430-436 in FIG. 4); and
3. QAM constellation bit mapping Using the above function, it is comparatively easy to work out the four candidate RS symbols. It should be noted that the derived four candidate RS symbols may not necessarily be different from each other. For example, two pairs of candidate RS symbols could be the same resulting in only two candidates. This possibility is addressed below.

Once the four candidate RS symbols are derived, the disclosed scheme may calculate an LLR for each of the four candidate RS symbols. Assuming a Gaussian probability density function for complex-valued noise, with standard deviation 6 for each of independent real and imaginary components, a maximum likelihood detector may be computed according to the following Equation 2:

$$P(Z(t)) \mid A(T)) = \frac{1}{\sigma\sqrt{2\pi}} \exp(-X_A^2(t)/2\sigma^2) \frac{1}{\sigma\sqrt{2\pi}} \exp(-Y_A^2(t)/2\sigma^2)$$

$$P(Z(t) \mid A(t)) = \frac{1}{\sigma^2 2\pi} \exp(-D_A^2(t)/2\sigma^2)$$

Equation 2

The corresponding conditional probabilities of the four candidate RS symbols may be calculated according to the following Equations 3a-3d:

$$P(Z(t) \mid A(t), Z(t-1) \mid A(t-1)) = \frac{1}{\sigma^4 4\pi^2} \exp(-(D_A^2(t) + D_A^2(t-1))/2\sigma^2) \quad \text{Equation 3a}$$

$$P(Z(t) \mid A(t), Z(t-1) \mid B(t-1)) = \frac{1}{\sigma^4 4\pi^2} \exp(-(D_A^2(t) + D_B^2(t-1))/2\sigma^2) \quad \text{Equation 3b}$$

$$P(Z(t) \mid B(t), Z(t-1) \mid A(t-1)) = \frac{1}{\sigma^4 4\pi^2} \exp(-(D_B^2(t) + D_A^2(t-1))/2\sigma^2) \quad \text{Equation 3c}$$

$$P(Z(t) \mid B(t), Z(t-1) \mid B(t-1)) = \frac{1}{\sigma^4 4\pi^2} \exp(-(D_B^2(t) + D_B^2(t-1))/2\sigma^2) \quad \text{Equation 3d}$$

Absolute values are not required. Relative values and ratios are appropriate. Dividing equations (3b), (3c) and (3d), by equation (3a) gives the ratios of the evaluated conditional probabilities:

$$q(Z(t)|A(t),Z(t-1)|A(t-1)) = 1.0 \quad \text{Equation 4a}$$

$$q(Z(t)|A(t),Z(t1)|B(t1)) = \exp((D_B^2(t1)D_A^2(t1))/2\sigma^2) \quad \text{Equation 4b}$$

$$q(Z(t)|B(t),Z(t-1)|A(t-1)) = \exp(-(D_B^2(t)-D_A^2(t))/2\sigma^2) \quad \text{Equation 4c}$$

$$q(Z(t)|B(t),Z(t-1)|B(t-1)) = \exp(-(D_B^2(t)-D_A^2(t)+D_B^2(t-1)-D_A^2(t-1))/2\sigma^2) \quad \text{Equation 4d}$$

To simplify the above equations, the following relationships (Equations 5-7) may be applied:

$$D_A^2(t) = X_A^2(t) + Y_A^2(t) \quad \text{Equation 5}$$

$$D_B^2(t) = X_B^2(t) + Y_A^2(t) \quad \text{Equation 6}$$

$$D_B^2(t) - D_A^2(t) = X_B^2(t) - X_A^2(t) \quad \text{Equation 7}$$

If K is the distance between successive QAM constellation points in the X or Y dimensions, the following Equations 8 and 9 may be applied:

$$D_B^2(t) - D_A^2(t) = (K - X_A(t))^2 - X_A^2(t) \quad \text{Equation 8}$$

$$D_B^2(t) - D_A^2(t) = K^2 - 2KX_A(t) \quad \text{Equation 9}$$

Note that the depiction in FIG. 5 may particularly cover an embodiment in which $X_A(t) \geq Y_A(t)$. Covering also the cases in which $X_A(t) < Y_A(t)$ yields the relationship in Equations 10 and 11:

$$D_B^2(t) D_A^2(t) = K^2 2KM_A(t) \quad \text{Equation 10}$$

Where $$M_A(t) = \max(X_A(t), Y_A(t)) \quad \text{Equation 11}$$

Substituting the above in the conditional probability ratios of Equations 4a-4d yields the conditional probabilities of Equations 12a-12d:

$$q(Z(t)|A(t),Z(t-1)|A(t-1)) = 1.0 \quad \text{Equation 12a}$$

$$q(Z(t)|A(t),Z(t-1)|B(t-1)) = \exp(-K^{2+}2KM_A(t-1))/2\sigma^2) \quad \text{Equation 12b}$$

$$q(Z(t)|B(t),Z(t-1)|A(t-1)) = \exp((-K^2 + 2KM_A(t))/2\sigma^2) \quad \text{Equation 12c}$$

$$q(Z(t)|B(t),Z(t-1)|B(t-1)) = \exp(-2K^2 + 2KM_A(t) + 2KM_A(t-1)/2\sigma^2 \quad \text{Equation 12d}$$

Taking the (negative) logarithms of the above conditional probability ratios, the log likelihood ratios (LLRs) of the four RS symbols may be obtained according to relationships (Equations) 13a-13d.

$$0.0 \quad \text{Equation 13a}$$

$$(K^2 - 2KM_A(t-1))/2\sigma^2 \quad \text{Equation 13b}$$

$$(K^2 - 2KM_A(t))/2\sigma^2 \quad \text{Equation 13c}$$

$$(2K^2 - 2KM_A(t) - 2KM_A(t-1))/2\sigma^2 \quad \text{Equation 13d}$$

These are the LLRs of the four candidate RS symbols. It has been noted that these four may not necessarily be distinct. If any two are the same, the LLR of that symbol may be obtained using Log-additions of the corresponding two LLR values of the above equations. The log-addition of two numbers A and B in above equation (13) is defined as $-\log(\exp(-A) + \exp(-B))$. After the log-addition, the numbers have to be normalized by subtracting the smallest value so that the LLR of the lead candidate is zero. An alternative may be to use a Max-Log-Map formulation and take the one with the smaller LLR. Simulation tests indicate that there may be no practical difference in performance. The disclosed scheme formulation given below is Max-Log-Map since it is comparatively simpler. Again, because the concern is only for a comparison of relative probabilities, certain of the constants can be removed to yield LLRs according to Equations 14a-14d:

$$0.0 \quad \text{Equation 14a}$$

$$(K-2M_A(t-1)) \quad \text{Equation 14b}$$

$$(K-2M_A(t)) \quad \text{Equation 14c}$$

$$2(K-M_A(t)-KM_A(t-1)) \quad \text{Equation 14d}$$

The four possible RS symbols are arranged in the ascending order of corresponding LLRs (scores):

$$\text{LLR}=0 \quad \text{RS Symbol 0}$$

$$\text{LLR}=\min((K-2M_A(t),K-2M_A(t-1)) \quad \text{RS Symbol 1}$$

$$\text{LLR}=\max(K-2M_A(t),K-2M_A(t-1)) \quad \text{RS symbol 2}$$

$$\text{LLR}=2(K-M_A(t)-M_A(t-1)) \quad \text{RS symbol 3}$$

It will be noted that the last three LLRs are positive numbers using the Max-Log-Map algorithm. In this manner, if two of the above RS symbols (as obtained from Equation 1) are the same, a smaller of the two LLRs from the above relationships may be associated with the common symbol.

In a specific implementation of the disclosed scheme, only one additional candidate may be kept in addition to the lead candidate. If the lead symbol is different from symbol 1, then symbol 1 may be the candidate. If the lead symbol is the same as symbol 1, then symbol 2 may be the candidate. If the lead symbol is the same as symbol 1 and symbol 2, symbol 3 may be the candidate. The corresponding LLR for the candidate may also be taken.

Those skilled in the art will recognize that minor modifications will need to be made to the above scheme for received data that lie outside the QAM constellation.

The lead symbol, candidate symbol(s) and corresponding LLRs may then go through the de-interleaver to the RS decoder, as illustrated in FIG. 3. The candidate block generator precedes the RS decoder and may be used to form many possible candidate data blocks from the received RS signal symbols. These may then be formed approximately in the descending order of probabilities using the LLR information.

It may not be possible to adopt an exact descending order of probability due to limitations in a particular hardware configuration. For example, only one RS symbol may be changed either with respect to a preceding block or with respect to the lead block (the RS block formed by all the lead RS symbols). This Gray-ordering of candidate blocks may significantly simplify syndrome generation for the disclosed scheme. These candidate blocks may be RS decoded using the hard-input RS decoder to output a valid RS codeword. Since the probability of a random 204-byte being decoded as a valid (204, 188) codeword is small (5.3e-5), this codeword may be chosen as the output.

The hard-input RS decoder may be designed to decode a 204-byte data block in 16 clock (540 MHz) cycles. In practice, the RS decoder may not precisely complete the decoding operation during this period. The RS decoder may operate in a manner such that it executes a decoding operation that may be just sufficient to determine whether an input block is correctable (or decodable). Once a correctable block is found, the RS decoder may complete the decoding process to output the corrected block. The 1024-QAM symbol rate is 7 MBaud. As such, with a 16-cycle RS decoder, it is possible to decode as many as 786 candidate blocks. The performance of the disclosed scheme may produce the 1 dB reduction by decoding up to 750 candidate blocks. A total gate-count to implement a soft-input RS decoder FEC system including a soft decision FEC module such as that shown in FIG. 2 may be about 50K excluding RAM.

Figure 6:
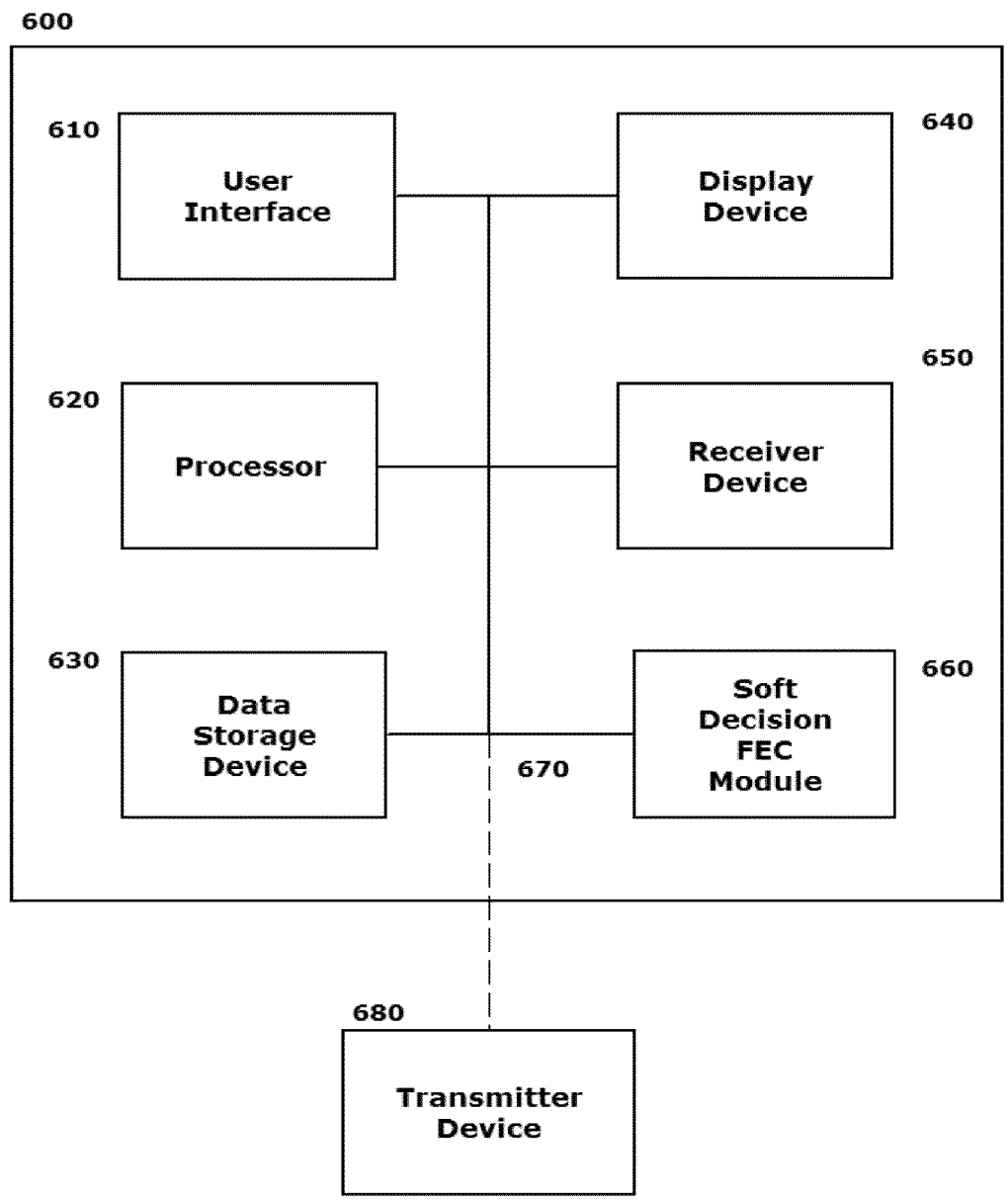
FIG. 6 illustrates a block diagram of an exemplary system for implementing a soft RS decoding scheme, technique or algorithm to improve physical layer performance in cable modems and cable gateways according to this disclosure.

FIG. 6 illustrates a block diagram of an exemplary system 600 for implementing a soft RS decoding scheme, technique or algorithm to improve physical layer performance in cable modems and cable gateways according to this disclosure.

The exemplary system 600 may include a user interface 610 by which the user can communicate with the exemplary system 600, and initiate operations of the exemplary system 600 for implementing the disclosed soft RS decoding scheme. It is recognized that the soft RS decoding scheme may be automatically applied by the exemplary system 600 to a data signal receiver from a transmitter device 680. Otherwise or additionally, the soft RS decoding scheme may be manipulated by a user of the exemplary system 600 according to a user input via the user interface 610. The user interface 610 may be configured as one or more conventional mechanisms that permit a user to input information to the exemplary system 600. The user interface 610 may include, for example, an integral keyboard, or a touchscreen with "soft" buttons for communicating commands and information to the exemplary systems 600. The user interface 610 may alternatively include a microphone by which a user may provide oral commands to the exemplary system 600 to be "translated" by a voice recognition program or otherwise. The user interface 610 may otherwise include any other like device for user operation of, and data exchange with, the exemplary system 600. A user may make inputs via the user interface 610 to simply turn the exemplary system 600 ON, thereby initiating a soft RS decoding scheme for the exemplary system 600.

The exemplary system 600 may include one or more local processors 620 for individually undertaking the processing and control functions that are carried out by the exemplary system 600. Processor(s) 620 may include at least one conventional processor or microprocessor that interprets and executes instructions and processes for processing a received data transmission signal according to the disclosed RS decoding scheme.

The exemplary system 600 may include one or more data storage devices 630. Such data storage device(s) 630 may be used to store data, and operating programs or applications to be used by the exemplary system 600, and specifically the processor(s) 620. Data storage device(s) 630 may include a random access memory (RAM) or another type of dynamic storage device that stores information and instructions for execution by the processor(s) 620. Data storage device(s) 630 may also include a read-only memory (ROM), which may include a conventional ROM device or another type of static storage device that stores static information and instructions for execution by the processor(s) 620. The data storage device(s) 630 will generally be those that are integral to the exemplary system 600. Otherwise, the data storage device(s) 630 may include a remote data storage device external to the exemplary system 600 that is in data communication with the exemplary system 600. At least one of the data storage devices 630 may be usable to store implementing instructions for the soft RS decoding scheme to be carried out by the exemplary system 600 or another communicating device, such as a cable modem or a cable gateway, with which the exemplary system 600 may be associated.

The exemplary system 600 may include at least one data display device 640, which may be configured as one or more conventional mechanisms that display information to the user of the exemplary system 600 for operation of the exemplary system 600 in its various operating modes, or otherwise for displaying, for example, usable information on a status of the operation of the soft RS decoding scheme executed, or otherwise controlled, by the exemplary system 600.

The exemplary system 600 may include a receiver device 650 that may be a cable modem or a cable gateway, or may be another device configured to operate according to a DOCSIS standard. The receiver device 650 may be in or associated with the exemplary system 600. Conversely, the exemplary system 600 may be in, or associated with, the receiver device 650, such as, for example, a cable modem or cable gateway.

The exemplary system 600 may include a soft decision FEC module 660. The soft decision FEC module 660 may be a specific component that may operate in conjunction with the processor(s) 620 and/or that may use information, such as data, stored in the data storage device(s) 630, or that may operate autonomously according to stored information and/or internal programming in the soft decision FEC module 660 itself. The soft decision FEC module 660 may alternatively be a function of at least one of the processor(s) 660. The soft decision FEC module 660 may be specifically programmed, or otherwise used, to decode a signal received from a transmitter device 680 according to the disclosed soft input RS decoding scheme. The soft decision FEC module 660 may be comprised of the components shown in FIG. 2 above and may operate according to the above-described detailed scheme for soft input RS decoding.

All of the various components of the exemplary system 600, as depicted in FIG. 6, may be connected by one or more data/control busses 670. The data/control bus(ses) 670 may provide internal wired or wireless communication between the various components of the exemplary system 600, as all of those components are housed integrally in the exemplary system 600, or are housed separately and in wired or wireless communication with the exemplary system 600.

It is anticipated that the various disclosed elements of the exemplary system 600 may be arranged in combinations of sub-systems as individual components or combinations of components. All of the depicted components may be integral to a single unit that is exemplary system 600, and include one or more receiver device(s) 650. Otherwise, individual components, or combinations of components, may be separately presented and in wired or wireless communication with other of the individual components of the exemplary system 600, or with the one or more receiver device(s) 650. In other words, no specific configuration as an integral unit including one or more receiver device(s) 650, or as a separate support unit associated with one or more receiver device(s) 650, for the exemplary system 600 is to be implied by the depiction in FIG. 6.

Figure 7A:
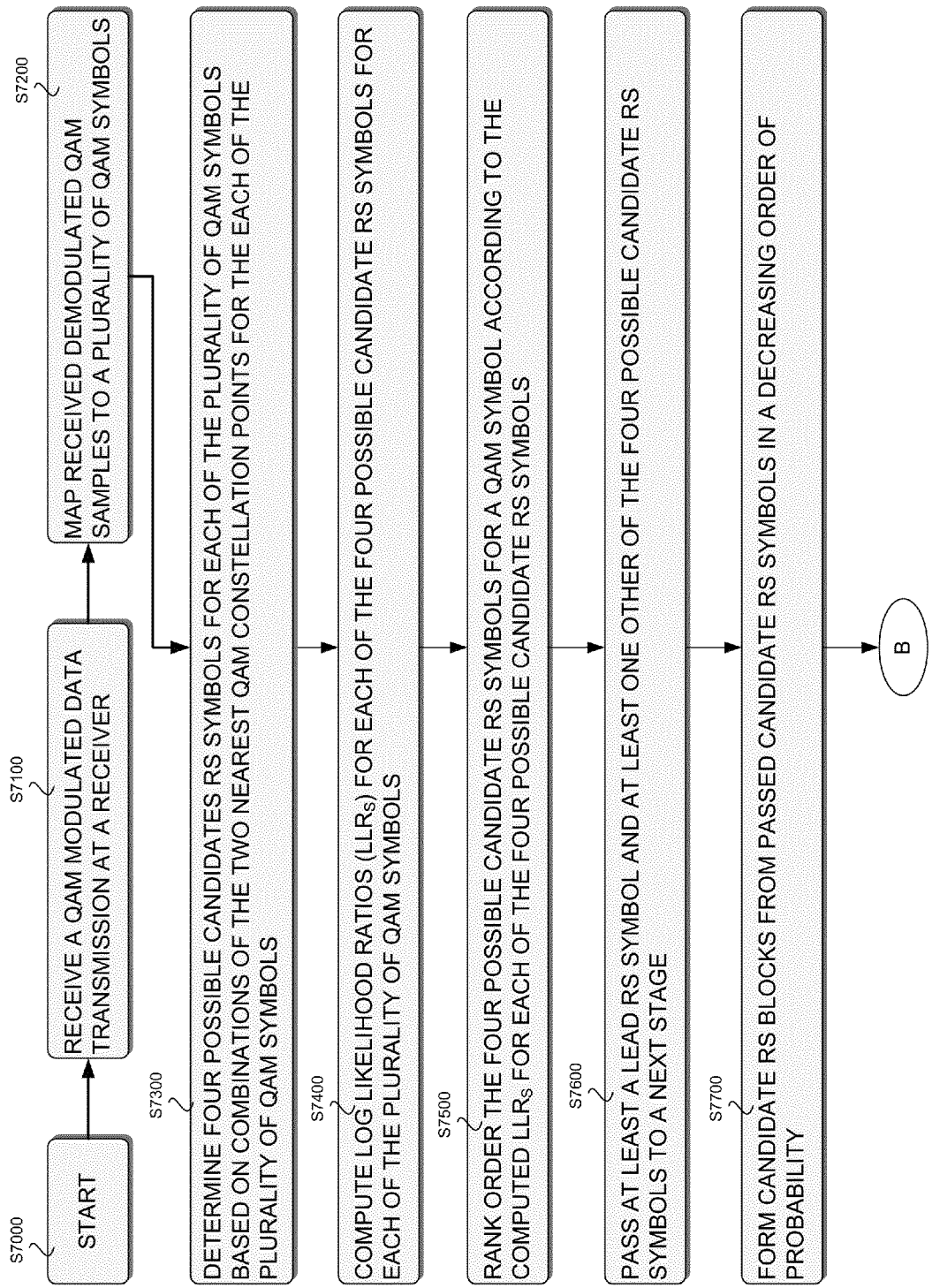
FIG. 7A illustrates a first part of a flowchart of an exemplary method for implementing a soft RS decoding scheme, technique or algorithm to improve physical layer performance in cable modems and cable gateways according to this disclosure.
Figure 7B:
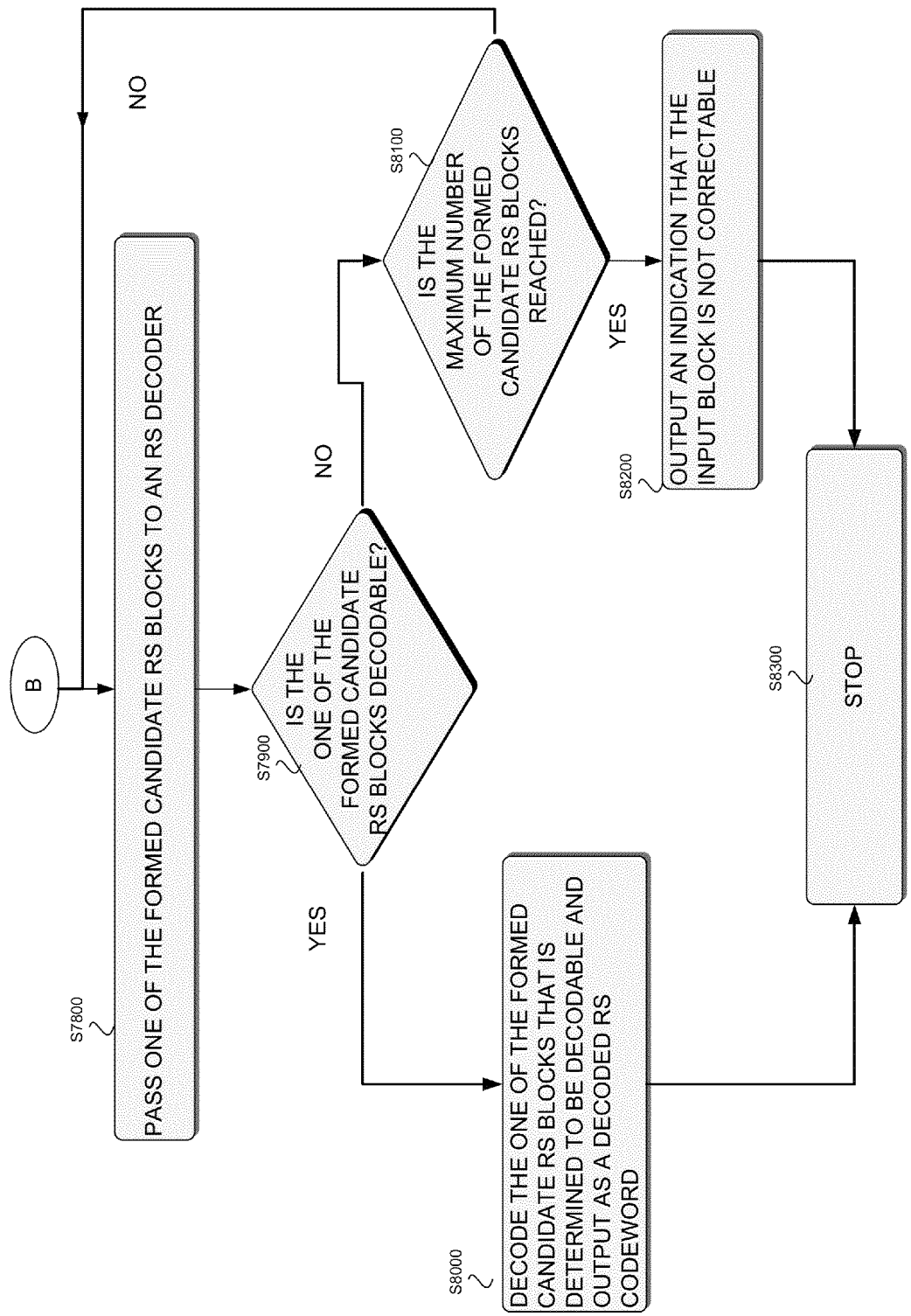
FIG. 7B illustrates a second part of a flowchart of an exemplary method for implementing a soft RS decoding scheme, technique or algorithm to improve physical layer performance in cable modems and cable gateways according to this disclosure.

The disclosed embodiment may include an exemplary method for implementing a soft RS decoding scheme, technique or algorithm to improve physical layer performance in cable modems and cable gateways according to this disclosure. FIG. 7A and FIG. 7B illustrates a block diagram of such an exemplary method. As shown in FIG. 7A, operation of the method commences at Step S7000 and proceeds to Step S7100.

In Step S7100, a QAM modulated data transmission may be received at a receiver. The receiver may be, for example, a cable modem or a cable gateway. The cable modem or cable gateway may be operated according to a DOCSIS standard. The QAM modulation may be 1024-QAM modulation, but the disclosed schemes are not limited to any particular QAM modulation, or to being hosted on any particular class of devices. Operation of the method proceeds to Step S7200.

In Step S7200, demodulated QAM samples may be mapped to a plurality of QAM symbols. The plurality of QAM symbols may be differentially decoded according to known schemes. The disclosed scheme is not limited to any particular differential decoding technique and may include, for example, a unitary or pass-through differential decoder. Operation of the method proceeds to Step S7300.

In Step S7300, four possible candidate RS symbols for each of the plurality QAM symbols may be determined based on combinations of a nearest two points in a QAM constellation for each of the plurality of QAM symbols. This is a deviation and an improvement over conventional methods that generally map received and demodulated QAM symbols directly to a nearest single point in the QAM constellation for each of the plurality of received and demodulated QAM symbols. Operation of the method proceeds to Step S7400.

In Step S7400, Log Likelihood Ratios (LLRs) may be computed for each of the four possible candidate RS symbols for each of the Plurality of QAM symbols. Because comparative values of the LLRs are appropriate, these computations may be appropriately simplified to a lowest order of complexity through application of various mathematical considerations. Operation of the method proceeds to Step S7500.

In Step S7500, the four possible candidate RS symbols for a QAM symbol may be rank ordered according to the computed LLRs for each of the four possible candidate RS symbols. Operation of the method proceeds to Step S7600.

In Step S7600, at least a lead symbol and at least one other of the four possible candidate RS symbols may be passed to a next stage. Operation of the method proceeds to Step S7700.

In Step S7700, candidate RS data blocks may be formed from the passed (input) candidate RS symbols in a decreasing order of probability. Operation of the method proceeds to Step S7800.

In Step S7800, one of the formed RS blocks may be passed to an RS decoder in the decreasing order of probability, with an RS block formed by lead symbols being passed first. Operation of the method proceeds to Step S7900.

Step S7900 is a determination step. In Step S7900, a determination regarding the presented RS block to determine whether the presented data block is decodable.

If in Step S7900, it is determined that the presented data block is not decodable, operation of the method proceeds to Step S8100 (detailed further below).

If in Step S7900, it is determined that the presented data block is decodable, operation of the method proceeds to Step S8000.

In Step S8000, a decodable block may be decoded in the RS decoder and output as a decoded RS codeword. Operation of the method proceeds to Step S8300, where operation of the method ceases.

Step S8100 is a determination step. In Step S8100, a determination is made regarding whether a maximum number of formed candidate RS blocks is reached.

If in Step S8100, it is determined that the maximum number of formed candidate RS blocks is not reached, operation of the method reverts to Step S7800 where others of the formed candidate RS blocks, in the decreasing order of probability, are passed to the RS decoder.

If in Step S8100, it is determined that the maximum number of formed candidate RS blocks is reached, operation of the method proceeds to Step S8200.

In Step S8200, an operation of the RS encoder may cease by indicating a block as uncorrectable when a certain predefined maximum number of presented blocks have been tested without finding a decodable block. Operation of the method proceeds to Step S8300, where operation of the method ceases.

The disclosed embodiments may include a non-transitory computer-readable medium storing instructions which, when executed by a processor, may cause the processor to execute the steps of a method as outlined above.

The above-described exemplary systems and methods reference certain conventional "known" methods or components to provide a brief, general description of suitable communication and processing environments in which the subject matter of this disclosure may be implemented for familiarity and ease of understanding. Although not required, embodiments of the disclosure may be provided, at least in part, in a form of hardware circuits, firmware or software computer-executable instructions to carry out the specific functions described, including as program modules to be executed by a processor that may execute the disclosed scheme for soft input RS decoding. Generally, program modules are understood to include routine programs, objects, components, data structures, and the like to perform particular tasks or implement particular data types in support of a specific function such as the disclosed implementing function.

Those skilled in the art will appreciate that other embodiments of the disclosed subject matter may be practiced in communication environments according to established cable networks. The disclosed communication schemes may be executed with many types of communicating devices, which may include, but are not limited to, cable gateways, cable modems and with many different fixed, semi-fixed, or mobile classes and configurations of communication equipment and/or computing systems.

Embodiments may be practiced in distributed network communication environments where tasks are performed by local processing systems and devices, generally as outlined above, some components of which may be linked to each other by hardwired links, wireless links, or a combination of the two through a cooperating communication network, including hybrid fiber/coaxial cable networks. In a distributed network environment, program modules, and any stored data or programs, may be located in both local and remote data storage devices.

As indicated briefly above, embodiments according to this disclosure may also include computer-readable media having stored computer-executable instructions or data structures recorded thereon that can be accessed, read and executed by a particular module or device, or system, in, for example, a mobile or fixed communicating device. Such computer-readable media can be any available media that can be accessed by a processor in, or in communication with, such a device executing a soft input RS decoding scheme. By way of example, and not limitation, such computer-readable media can comprise RAM, ROM, EEPROM, CD-ROM, DVD-ROM, flash drives, thumb drives, data memory cards or other analog or digital data storage devices that can be used to carry or store desired program elements or steps in the form of accessible computer-executable instructions and/or data structures. When information is transferred or provided over a network or another communications connection the receiving processor properly views the connection as a computer-readable medium. Thus, any such connection is properly termed a computer-readable medium. Combinations of the above should also be included within the scope of the computer-readable media for the purposes of this disclosure.

Computer-executable instructions include, for example, non-transitory instructions and data that can be executed and accessed respectively to cause communicating components, including wireless communicating components, or processors associated with such components, to perform certain of the above-specified functions, individually or in combination. Computer-executable instructions also include program modules that are remotely stored for access by a communicating device or system to be executed by processors in the communicating device or system when the communicating device or system is caused to communicate across any available communication link, particularly those described in exemplary manner above.

The exemplary depicted sequence of executable instructions, or associated data structures for executing those instructions, represents one example of a corresponding sequence of acts for implementing the functions described in the steps. The steps of the method, as depicted in FIG. 7A and FIG. 7B, are not intended to imply that all of the depicted and described steps must be executed as part of a complete method, or that the steps must be executed in any particular order, except as may be necessarily inferred when one of the depicted and described steps is a necessary precedential condition to accomplishing another of the depicted and described steps. The depicted and described steps, where appropriate, may be executed in series or in parallel.

Although the above description may contain specific details, these details should not be construed as limiting the claims in any way. Other configurations of the described embodiments of the disclosed systems and methods are part of the scope of this disclosure. For example, the principles of the disclosure may be applied to each individual communicating device where each individual communicating device may independently operate according to the disclosed system constraints or method steps. This enables each user of a separate communicating device to use the benefits of the disclosure even if any one of the large number of possible applications do not need a specific aspect of the functionality described and depicted in this disclosure. In other words, there may be multiple instances of the separate communicating devices, including cable modems, each processing signal content in various possible ways to effect the soft input RS decoding schemes. The disclosed system does not necessarily need to be one single system, networked or otherwise, used by all end users or undertaken identically by each communicating device or system, cable gateway, cable modem or the like. Accordingly, the appended claims and their legal equivalents should only define the disclosure, rather than any of the specific examples given.

We claim:

1. A communicating system, comprising:
a receiving device; and
a processing device associated with the receiving device, the processing device being programmed to
associate two or more points in a quadrature amplitude modulation (QAM) constellation with a received signal symbol;
map the received signal symbol to a plurality of candidate decoder symbols based on distances to the associated points in the QAM constellation;
calculate probabilities for each of the plurality of mapped candidate decoder symbols;
rank order the plurality of mapped candidate decoder symbols;
form candidate forward error correction blocks from the plurality of rank ordered candidate decoder symbols; and
determine that at least one of the forward error correction blocks is decodable.

2. The communicating system of claim 1, the receiving device being at least one of a cable modem and a cable gateway device.

3. The communicating system of claim 2, the at least one of the cable modem and the cable gateway device operating according to a Data Over Cable Service Interface Specification standard.

4. The communicating system of claim 1, the associated points in the QAM constellation being the two points nearest the received signal symbol in the QAM constellation.

5. The communicating system of claim 1, the mapping the received signal symbol comprising mapping a series of received N-bit QAM signal symbols to a plurality of M-bit Reed-Solomon (RS) decoder symbols, N and M being integer values and M being less than N.

6. The communicating system of claim 5, the received N-bit QAM signal symbols being 10-bit signal samples for a 1024-QAM signal, and the plurality of M-bit RS decoder symbols being 8-bit decoder symbols.

7. The communicating system of claim 1, the mapping of the received signal symbol to a plurality of candidate decoder symbols including employing a differential decoder.

8. The communicating system of claim 1, the calculated probabilities for each of the plurality of mapped candidate decoder symbols being Log Likelihood Ratios (LLRs).

9. The communicating system of claim 8, the processing device mathematically reducing the calculated LLRs to simplest mathematical terms.

10. The communicating system of claim 1, the processing device decoding the at least one of the candidate forward error correction blocks, formed from the plurality of mapped candidate decoder symbols, that is determined to be decodable and outputting a decoded codeword.

11. A signal decoding method, comprising:
receiving a QAM signal symbol with a receiving device;
associating, with a processor, two or more points in a QAM constellation with the received QAM signal symbol;
mapping, with the processor, the received QAM signal symbol to a plurality of candidate decoder symbols based on distances to the associated points in the QAM constellation;
calculating, with the processor, probabilities for each of the plurality of mapped candidate decoder symbols;
rank ordering, with the processor, the plurality of mapped candidate decoder symbols;
forming, with the processor, candidate forward error correction blocks from the plurality of mapped candidate decoder symbols;
determining, with the processor, that at least one of the candidate forward error correction blocks is decodable;
decoding, with the processor, the at least one of the candidate forward error correction blocks that is determined to be decodable; and
outputting a decoded codeword.

12. The method of claim 11, the determining that the at least one of the candidate forward correction blocks is decodable comprising sequentially evaluating the forward error correction blocks in a decreasing order of probability, and ceasing the determining when an evaluated forward error correction block is determined to be decodable.

13. The method of claim 11, the determining that the at least one of the candidate forward correction blocks is decodable comprising sequentially evaluating a number X of the forward error correction blocks in a decreasing order of probability, and ceasing the determining when the number X of the forward error correction blocks is evaluated and none of the number X of the evaluated forward error correction blocks is determined to be decodable.

14. The method of claim 11, the receiving device being at least one of a cable modem and a cable gateway device.

15. The method of claim 14, the at least one of the cable modem and the cable gateway device operating according to a Data Over Cable Service Interface Specification standard.

16. The method of claim 11, the associated points in the QAM constellation being the two points nearest the received QAM signal symbol in the QAM constellation.

17. The method of claim 11, the mapping the received QAM signal symbol comprising mapping a series of received N-bit QAM signal symbols to a plurality of M-bit RS decoder symbols, N and M being integer values and M being less than N.

18. The method of claim 17, the received N-bit QAM signal symbols being 10-bit signal samples for a 1024-QAM signal, and the plurality of M-bit RS decoder symbols being 8-bit decoder samples.

19. The method of claim 11, the mapping of the received QAM signal symbol to a plurality of candidate decoder symbols including differentially decoding the received QAM signal symbol.

20. The method of claim 11, the calculated probabilities for each of the plurality of mapped candidate decoder symbols being Log Likelihood Ratios (LLRs).

21. The method of claim 20, the calculating, with the processor, including mathematically reducing the calculated LLRs to simplest mathematical terms.

22. A non-transitory computer-readable medium storing computer-readable instructions which, when executed by a processor, cause the processor to execute a signal decoding method, comprising:
receiving a QAM signal symbol with a receiving device;
associating two or more points in a QAM constellation with the received QAM signal symbol;
mapping the received QAM signal symbol to a plurality of candidate decoder symbols based on distances to the associated points in the QAM constellation;
calculating probabilities for each of the plurality of mapped candidate decoder symbols;
rank ordering the plurality of mapped candidate decoder symbols;
forming candidate forward error correction blocks from the plurality of mapped candidate decoder symbols;
determining that at least one of the candidate forward error correction blocks is decodable;
decoding the at least one of the candidate forward error correction blocks that is determined to be decodable; and
outputting a decoded codeword.

23. The non-transitory computer-readable medium of claim 22, the determining that the at least one of the candidate forward correction blocks is decodable comprising sequentially evaluating the forward error correction blocks in a decreasing order of probability,
the method further comprising ceasing the determining when an evaluated forward error correction block is determined to be decodable.

24. The non-transitory computer-readable medium of claim 22, the determining that the at least one of the candidate forward correction blocks is decodable comprising sequentially evaluating a number X of the forward error correction blocks in a decreasing order of probability,
the method further comprising ceasing the determining when the number X of the forward error correction blocks is evaluated and none of the number X of the evaluated forward error correction blocks is determined to be decodable.

25. The non-transitory computer-readable medium of claim 22, the receiving device being at least one of a cable modem and a cable gateway device.

26. The non-transitory computer-readable medium of claim 25, the at least one of the cable modem and the cable gateway device operating according to a Data Over Cable Service Interface Specification standard.

27. The non-transitory computer-readable medium of claim 22, the associated points in the QAM constellation being the two points nearest the received QAM signal symbol in the QAM constellation.

28. The non-transitory computer-readable medium of claim 22, the mapping the received QAM signal symbol comprising mapping a series of received N-bit QAM signal symbols to a plurality of M-bit RS decoder symbols, N and M being integer values and M being less than N.

29. The non-transitory computer-readable medium of claim 28, the received N-bit QAM signal symbols being 10-bit signal samples for a 1024-QAM signal, and the plurality of M-bit RS decoder symbols being 8-bit decoder samples.

30. The non-transitory computer-readable medium of claim 22, the mapping of the received QAM signal symbol to a plurality of candidate decoder symbols including differentially decoding the received QAM signal symbol.

31. The non-transitory computer-readable medium of claim 22, the calculated probabilities for each of the plurality of mapped candidate decoder symbols being Log Likelihood Ratios (LLRs).

32. The non-transitory computer-readable medium of claim 31, the calculating the probabilities including mathematically reducing the calculated LLRs to simplest mathematical terms.

* * * * *